United States Patent
Hosono et al.

(10) Patent No.: US 9,269,826 B2
(45) Date of Patent: Feb. 23, 2016

(54) AMORPHOUS OXIDE AND THIN FILM TRANSISTOR

(75) Inventors: Hideo Hosono, Kanagawa (JP); Masahiro Hirano, Tokyo (JP); Hiromichi Ota, Aichi (JP); Toshio Kamiya, Kanagawa (JP); Kenji Nomura, Tokyo (JP)

(73) Assignees: JAPAN SCIENCE AND TECHNOLOGY AGENCY, Kawaguchi-shi (JP); CANON KABUSHIKI KAISHA, Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 0 days.

(21) Appl. No.: 12/984,960

(22) Filed: Jan. 5, 2011

(65) Prior Publication Data

US 2011/0101352 A1    May 5, 2011

Related U.S. Application Data

(62) Division of application No. 10/592,431, filed as application No. PCT/JP2005/003273 on Feb. 28, 2005.

(30) Foreign Application Priority Data

Mar. 12, 2004 (JP) ................................. 2004-071477
Nov. 10, 2004 (JP) ................................. 2004-325938

(51) Int. Cl.
*H01L 29/786* (2006.01)
*C23C 14/00* (2006.01)
(Continued)

(52) U.S. Cl.
CPC ...... *H01L 29/78696* (2013.01); *C23C 14/0021* (2013.01); *C23C 14/086* (2013.01);
(Continued)

(58) Field of Classification Search
CPC .. C23C 14/0021; C23C 14/086; C23C 14/28; C23C 14/3414; H01L 21/02554; H01L 29/78696; H01L 21/02631; H01L 27/1225; H01L 29/7869; H01L 29/78693; H01L 21/02565
USPC ................. 257/43, 4, 9, 52, 57, 66, 103, 289, 257/229.296
IPC . C23C 14/0021, 14/086, 14/28, 14/3414; H01L 21/02554, 29/78696, 21/02631, 27/1225, H01L 29/7869, 29/78693, 21/02565
See application file for complete search history.

(56) References Cited

U.S. PATENT DOCUMENTS 4,400,254 A    8/1983  Freller et al.
4,752,814 A *  6/1988  Tuan ............................... 257/60
(Continued)

FOREIGN PATENT DOCUMENTS

JP    63-239117 A    10/1988
JP    05-251705 A     9/1993
(Continued)

OTHER PUBLICATIONS

Abstract of Hamada in English.*
(Continued)

*Primary Examiner* — Hrayr A Sayadian
(74) *Attorney, Agent, or Firm* — Westerman, Hattori, Daniels & Adrian, LLP

(57) ABSTRACT

The present invention relates to an amorphous oxide and a thin film transistor using the amorphous oxide. In particular, the present invention provides an amorphous oxide having an electron carrier concentration less than $10^{18}/cm^3$, and a thin film transistor using such an amorphous oxide. In a thin film transistor having a source electrode 6, a drain electrode 5, a gate electrode 4, a gate insulating film 3, and a channel layer 2, an amorphous oxide having an electron carrier concentration less than $10^{18}/cm^3$ is used in the channel layer 2.

1 Claim, 6 Drawing Sheets

(51) Int. Cl.
*C23C 14/08* (2006.01)
*C23C 14/28* (2006.01)
*C23C 14/34* (2006.01)
*H01L 21/02* (2006.01)
*H01L 27/12* (2006.01)

(52) U.S. Cl.
CPC ............ *C23C 14/28* (2013.01); *C23C 14/3414* (2013.01); *H01L 21/02554* (2013.01); *H01L 21/02565* (2013.01); *H01L 21/02631* (2013.01); *H01L 27/1225* (2013.01); *H01L 29/7869* (2013.01); *H01L 29/78693* (2013.01)

(56) References Cited

U.S. PATENT DOCUMENTS

| | | | |
|---|---|---|---|
| 5,395,663 A * | 3/1995 | Tabata et al. | 427/554 |
| 5,563,000 A * | 10/1996 | Hatwar | G11B 5/66 360/135 |
| 5,565,266 A * | 10/1996 | Hatwar | G11B 11/10589 360/135 |
| 5,622,653 A | 4/1997 | Orita et al. | |
| 5,681,671 A | 10/1997 | Orita et al. | |
| 5,705,826 A * | 1/1998 | Aratani et al. | 257/40 |
| 5,744,864 A | 4/1998 | Cillessen et al. | |
| 5,843,341 A | 12/1998 | Orita et al. | |
| 5,910,761 A | 6/1999 | Kobayashi et al. | |
| 5,955,178 A | 9/1999 | Orita et al. | |
| 6,294,274 B1 | 9/2001 | Kawazoe et al. | |
| 6,617,056 B1 * | 9/2003 | Hara | C23C 14/0036 204/192.14 |
| 6,727,522 B1 | 4/2004 | Kawasaki et al. | |
| 6,969,536 B1 | 11/2005 | Tuck et al. | |
| 7,061,014 B2 * | 6/2006 | Hosono et al. | 257/43 |
| 2001/0019244 A1 | 9/2001 | Yamazaki et al. | |
| 2001/0030717 A1 * | 10/2001 | Kaneko | G02F 1/134363 349/43 |
| 2001/0055838 A1 | 12/2001 | Walker et al. | |
| 2002/0094643 A1 * | 7/2002 | Solomon et al. | 438/279 |
| 2003/0047785 A1 * | 3/2003 | Kawasaki et al. | 257/350 |
| 2003/0160260 A1 | 8/2003 | Hirai et al. | |
| 2003/0218221 A1 | 11/2003 | Wager et al. | |
| 2003/0218222 A1 | 11/2003 | Wager et al. | |
| 2004/0127038 A1 * | 7/2004 | Carcia et al. | 438/689 |
| 2005/0017244 A1 * | 1/2005 | Hoffman | H01L 29/7869 257/72 |
| 2005/0017302 A1 * | 1/2005 | Hoffman | 257/347 |
| 2005/0039670 A1 * | 2/2005 | Hosono et al. | 117/2 |
| 2005/0151210 A1 | 7/2005 | Li et al. | |
| 2005/0156254 A1 | 7/2005 | Li et al. | |
| 2005/0173734 A1 * | 8/2005 | Yoshioka et al. | 257/202 |
| 2005/0199879 A1 | 9/2005 | Hoffman et al. | |
| 2005/0199880 A1 * | 9/2005 | Hoffman | H01L 29/7869 257/72 |
| 2005/0199881 A1 * | 9/2005 | Hoffman | H01L 29/7869 257/72 |
| 2005/0199959 A1 * | 9/2005 | Chiang | H01L 29/7869 257/368 |
| 2005/0199960 A1 * | 9/2005 | Hoffman | H01L 29/7869 257/368 |
| 2005/0199961 A1 | 9/2005 | Hoffman et al. | |
| 2005/0199967 A1 | 9/2005 | Hoffman | |
| 2005/0200273 A1 * | 9/2005 | Nozawa | 313/503 |
| 2007/0194379 A1 * | 8/2007 | Hosono et al. | 257/347 |

FOREIGN PATENT DOCUMENTS

| | | | | |
|---|---|---|---|---|
| JP | 05251705 A * | 9/1993 | | H01L 29/784 |
| JP | 8-245220 A | 9/1996 | | |
| JP | 2000-044236 A | 2/2000 | | |
| JP | 2002-076356 A | 3/2002 | | |
| JP | 2002-289859 A | 10/2002 | | |
| JP | 2002289859 A * | 10/2002 | | H01L 29/786 |
| JP | 2003-86808 A | 3/2003 | | |
| JP | 2003-298062 A | 10/2003 | | |
| JP | 2004-103957 A | 4/2004 | | |
| WO | 03/040441 A1 | 5/2003 | | |
| WO | WO 03/040441 | * | 5/2003 | |
| WO | WO2005/088726 | * | 9/2005 | |
| WO | WO 2005-088726 | * | 9/2005 | |

OTHER PUBLICATIONS

Abstract of Okumura in English.*
Machine English Translation of Hamada.*
Machine English Translation of Okumura.*
JPO Machine English translation of Okumura.
Nomura et al., "Room-Temperature Fabrication of Transparent . . .," by , Nature, vol. 432, pp. 488-492 (2004).
Carcia, "ZnO [TFT] for Flexible Electronics," Mat. Res. Soc. Symp., vol. 769, pp. H72.1-H72.6 (2003).
Milman and Halkias, "Integrated Electronics," pp. 49-52 and 310-326 (1972).
Narushima, "A p-type Amorphous Oxide Semiconductor . . . ," Advanced Materials, vol. 15, pp. 1409-1413 (2003).
Orita, Amorphous Transparent Conductive Oxide InGa3)ZnO0m(m=<4):a Zn 4s Conductor,Philosophical Magazine B, vol. 81, pp. 501-515 (2001).
Nomura, "Thin Film Transistor Fabricated in Single-Crystalline Transparent Oxide Semiconductor," Science, vol. 300, pp. 1269-1272.
World Organization Document No. WO03040441 for a Japanese Patent application application by "Hirano" (which is provided herein; U.S. Pat. No. 7,061,014 to "Hosono," listed in the 892, is provided as an English translation, and to which references are ,ade in this Office Action).
Bellingham et al, "Electrical and Optical Properties of Amorphous Indium Oxide," J. Phys Matter, 1990, vol. 2, pp. 6207-6221.
Carcia, P.F. et al "Transparent ZnO thin-film transistor fabricated by rf magnetron sputtering," Applied Physics Letters, Feb. 17, 2003, vol. 82 No. 7, pp. 1117-1119.
International Preliminary Report on Patentability of PCT/JP2005/003273, filed Feb. 28, 2005.
Minami Tadatsugu, "New N-Type Transparent Conducting Oxides," Materials Research Society Bulletin, Aug. 2000, pp. 38-44.
Nomura, Kenji et al "Electron Transport in InGaO3(ZnO)m (m=integer) studied using single-crystalline thin films and transparent MISFETs," Thin Solid Films 445, 2003, vol. 445, pp. 322-326.
International Search Report of PCT/JP2005/003273, mailing date Jun. 7, 2005.
Presley, R. E. et al., "Tin oxide transparent thin-film transistors", Journal of Physics D: Applied Physics, 2004, pp. 2810-2813, vol. 37.
Prins, M. W. J et al., "A ferroelectric transparent thinfilm transistor", Applied Physics Letters, Jun. 1996, pp. 3650-3652, vol. 68, No. 25.
Klasens, H. A. et al., "A tin oxide field-effect transistor", Solid-State Electronics, 1964, pp. 701-702, vol. 7.
Orita M. et al., "A Novel Amorphous Transparent Conductive Oxide Film InGaO3(ZnO)m", Extended Abstracts of The Japan Society of Applied Physics and Related Societies, No. 2, p. 577, 28a-ZB-1, (2000), w/English translation, cited in Opposition of European Pat. No. 2 246 894, dated Sep. 11, 2014.
Extract of textbook "Technology of Transparent Conductive Film", pp. 196-197, (1999), w/partial English translation, cited in Opposition of European Pat. No. 2 246 894, dated Sep. 11, 2014.
Extract of textbook, "Technology of Transparent Conductive Film", Japan Society for the Promotion of Science, (1999) w/English translation of the bibliographic data, cited in Opposition of European Pat. No. 2 246 894, dated Sep. 11, 2014.
Sze S. M., Extract of Textbook "Physics of Semiconductor Devices", pp. 42-47, (1969), cited in Opposition of European Pat. No. 2 246 894, dated Sep. 11, 2014.
Extract of Textbook, "Technology of Transparent Conductive Film", pp. 80-89 and pp. 148-155, w/partial English translation, cited in Opposition of European Pat. No. 2 246 894, dated Sep. 11, 2014.
Opposition Statement to European Pat. No. 2 246 894 dated Sep. 11, 2014 (18 pages).

* cited by examiner

AMORPHOUS OXIDE AND THIN FILM TRANSISTOR

CROSS-REFERENCE TO RELATED APPLICATIONS

This is a divisional application of U.S. patent application Ser. No. 10/592,431, filed on Sep. 11, 2006, which is a 371 of International Application No. PCT/JP05/03273, filed on Feb. 28, 2005, which claims the benefit of priority from the prior Japanese Patent Application Nos. 2004-071477, filed on Mar. 12, 2004 and 2004-325938 filed on Nov. 10, 2004, the entire contents of which are incorporated herein by references.

TECHNICAL FIELD

The present invention relates to amorphous oxides and thin film transistors.

BACKGROUND ART

A thin film transistor (TFT) is a three-terminal element having a gate terminal, a source terminal, and a drain terminal. It is an active element in which a semiconductor thin film deposited on a substrate is used as a channel layer for transportation of electrons or holes and a voltage is applied to the gate terminal to control the current flowing in the channel layer and switch the current between the source terminal and the drain terminal. Currently, the most widely used TFTs are metal-insulator-semiconductor field effect transistors (MISFETs) in which the channel layer is composed of a polysilicon or amorphous silicon film.

Recently, development of TFTs in which ZnO-based transparent conductive oxide polycrystalline thin films are used as the channel layers has been actively pursued (Patent Document 1). These thin films can be formed at low temperatures and is transparent in visible light; thus, flexible, transparent TFTs can be formed on substrates such as plastic boards and films.

However, known ZnO rarely forms a stable amorphous phase at room temperature and mostly exhibits polycrystalline phase; therefore, the electron mobility cannot be increased because of the diffusion at the interfaces of polycrystalline grains. Moreover, ZnO tends to contain oxygen defects and a large number of carrier electrons, and it is thus difficult to decrease the electrical conductivity. Therefore, it has been difficult to increase the on/off ratio of the transistors.

Patent Document 2 discloses an amorphous oxide represented by $Zn_xM_yIn_zO_{(x+3y/2+3z/2)}$ (wherein M is at least one element selected from Al and Ga, the ratio x/y is in the range of 0.2 to 12, and the ratio z/y is in the range of 0.4 to 1.4). However, the electron carrier concentration of the amorphous oxide film obtained herein is $10^{18}/cm^3$ or more. Although this is sufficient for regular transparent electrodes, the film cannot be easily applied to a channel layer of a TFT. This is because it has been found that a TFT having a channel layer composed of this amorphous oxide film does not exhibit a sufficient on/off ratio and is thus unsuitable for TFT of a normally off type.

Patent Document 1: Japanese Unexamined Patent Application Publication No. 2003-298062

Patent Document 2: Japanese Unexamined Patent Application Publication No. 2000-044236

DISCLOSURE OF INVENTION

An object of the present invention is to provide an amorphous oxide having a low electron carrier concentration and to provide a thin film transistor having a channel layer composed of such an amorphous oxide.

The present invention provides: (1) an amorphous oxide having an electron carrier concentration less than $10^{18}/cm^3$. In the present invention, the electron carrier concentration of the amorphous oxide is preferably $10^{17}/cm^3$ or less or $10^{16}/cm^3$ or less.

The present invention also provides: (2) an amorphous oxide in which electron mobility thereof increases with the electron carrier concentration.

The present invention also provides: (3) the amorphous oxide according to item (1) or (2) above, in which the electron mobility is more than 0.1 cm$^2$/(V·sec).

The present invention also provides: (4) the amorphous oxide according to item (2) or (3) above, exhibiting degenerate conduction. Note that "degenerate conduction" used herein is defined as a state in which the thermal activation energy for temperature dependency of electrical resistance is 30 meV or less.

Another aspect of the present invention provides: (5) the amorphous oxide according to any one of items (1) to (4) above, in which the amorphous oxide is a compound that contains at least one element selected from Zn, In, and Sn as a constituent and is represented by $[(Sn_{1-x}M4_x)O_2]a \cdot [(In_{1-y}M3_y)_2O_3]b \cdot [(Zn_{1-z}M2_z)O]c$ (wherein $0 \leq x \leq 1$, $0 \leq y \leq 1$, $0 \leq z \leq 1$; x, y, and z are not simultaneously 1; $0 \leq a \leq 1$, $0 \leq b \leq 1$, $0 \leq c \leq 1$, and $a+b+c = 1$; M4 is a group IV element (Si, Ge, or Zr) having an atomic number smaller than that of Sn; M3 is Lu or a group III element (B, Al, Ga, or Y) having an atomic number smaller than that of In; and M2 is a group II element (Mg or Ca) having an atomic number smaller than that of Zn).

In the present invention, the amorphous oxide according to (5) above may further contain at least one element selected from group V elements (V, Nb, and Ta) M5 and W.

Another aspect of the present invention provides: (6) a thin film transistor including the amorphous oxide according to any one of (1) to (4) above, in which the amorphous oxide is a single compound represented by $[(In_{1-y}M3_y)_2O_3(Zn_{1-x}M2_x)O]_m$ (wherein $0 \leq x \leq 1$; $0 \leq y \leq 1$; x and y are not simultaneously 1; m is zero or a natural number less than 6; M3 is Lu or a group III element (B, Al, Ga, or Y) having an atomic number smaller than that of In; and M2 (Mg or Ca) is a group II element having an atomic number smaller than that of Zn) in a crystallized state or a mixture of the compounds with different values of m. M3 is, for example, Ga, and M2 is, for example Mg.

The present invention also provides the amorphous oxide according to any one of (1) to (6) above formed on a glass substrate, a metal substrate, a plastic substrate, or a plastic film. The present invention also provides a field effect transistor including a channel layer composed of the amorphous oxide described above. The field effect transistor of the present invention is characterized in that the gate insulating film is one of $Al_2O_3$, $Y_2O_3$, and $HfO_2$ or a mixed crystal compound containing at least two of these compounds.

Another aspect of the present invention provides: (7) a transparent semi-insulating amorphous oxide thin film comprising In—Ga—Zn—O, in which the composition in a crystallized state is represented by $InGaO_3(ZnO)_m$ (wherein m is a number less than 6 and $0 < x \leq 1$), the electron mobility is more than 1 cm$^2$/(V·sec) and the electron carrier concentration is les than $10^{18}/cm^3$.

Furthermore, the present invention also provides: (8) a transparent semi-insulating amorphous oxide thin film comprising In—Ga—Zn—Mg—O, in which the composition in a crystallized state is represented by $InGaO_3(Zn_{1-x}Mg_xO)_m$ (wherein m is a number less than 6 and $0 < x \leq 1$), the electron mobility is more than 1 cm$^2$/(V·sec) and the electron carrier concentration is les than 10$^{18}$/cm$^3$. Moreover, the present invention also provides a method for forming the transparent semi-insulating amorphous oxide thin film in which an impurity ion for increasing the electrical resistance is not intentionally added and the deposition is conducted in an atmosphere containing oxygen gas.

A thin-film transistor according to another aspect of the present invention includes a source electrode, a drain electrode, a gate electrode a gate insulating film and a channel layer, in which the channel layer contains an amorphous oxide having an electron carrier concentration of less than 10$^{18}$/cm$^3$. Preferably, the electron carrier concentration of the amorphous oxide is 10$^{17}$/cm$^3$ or less or 10$^{16}$/cm$^3$ or less. The amorphous oxide is an oxide containing In, Ga, and Zn, in which the atomic ratio In:Ga:Zn is 1:1:m (m<6). Alternatively, the amorphous oxide is an oxide including In, Ga, Zn, and Mg, in which the atomic ratio In:Ga:Z$_{1-x}$Mg$_x$ is 1:1:m (m<6), wherein 0<x≤1.

The amorphous oxide is selected from In$_x$Ga$_{1-x}$ oxides (0≤x≤1), In$_x$Zn$_{1-x}$ oxides (0.2≤x≤1), In$_x$Sn$_{1-x}$ oxides (0.8≤x≤1), and In$_x$(Zn, Sn)$_{1-x}$ oxides (0.15≤x≤1).

In a thin film transistor of the present invention, a material in which the electron mobility increases with the electron carrier concentration can be used as the amorphous oxide.

According to the present invention, an amorphous oxide having a low electron carrier concentration can be provided, and a thin film transistor including a channel layer composed of such an amorphous oxide can be provided.

BEST MODE FOR CARRYING OUT THE INVENTION

An amorphous oxide of the present invention is characterized in that the electron carrier concentration is less than 10$^{18}$/cm$^3$. A thin film transistor (TFT) of the present invention is characterized in that an amorphous oxide having an electron carrier concentration less than 10$^{18}$/cm$^3$ is used in the channel layer.

Figure 5:
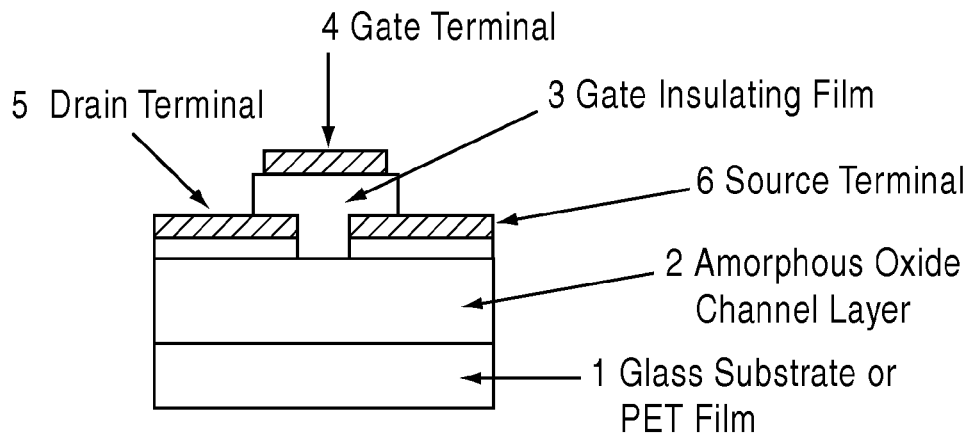
FIG. 5 is a schematic illustration showing a structure of a top gate TFT element.

For example, as shown in FIG. 5, the TFT is made by forming a channel layer 2 on a substrate 1 and a gate insulating film 3, a gate electrode 4, a source electrode 6, and a drain electrode 5 on the channel layer 2. In this invention, an amorphous oxide having an electron carrier concentration less than 10$^{18}$/cm$^3$ is used in the channel layer.

The structure of the TFT to which the present invention can be applied is not limited to the staggered structure (top-gate structure) shown in FIG. 5 in which a gate insulating film and a gate terminal (electrode) are sequentially stacked on a semiconductor channel layer. For example, the TFT may have an inverted staggered structure (bottom-gate structure) in which a gate insulating film and a semiconductor channel layer are sequentially stacked on a gate terminal. The electron carrier concentration mentioned above is a value measured at room temperature. Room temperature is, for example, 25° C. and, in particular, is appropriately selected from the range of about 0° C. to about 40° C.

The electron carrier concentration of the amorphous oxide of the present invention need not be less than 10$^{18}$/cm$^3$ all through the range of 0° C. to 40° C. For example, it is sufficient if the carrier electron concentration is less than 10$^{18}$/cm$^3$ at 25° C. When the electron carrier concentration is reduced to 10$^{17}$/cm$^3$ or less and more preferably to 10$^{16}$/cm$^3$ or less, TFTs of a normally off type can be obtained in high yield. The electron carrier concentration can be determined by hall-effect measurement.

In the present invention, "amorphous oxide" is defined as an oxide that shows a halo pattern in an X-ray diffraction spectrum and exhibits no particular diffraction line. The lower limit of the electron carrier concentration of the amorphous oxide of the present invention is not particularly limited as long as the oxide can be used as the TFT channel layer. The lower limit is, for example, 10$^{12}$/cm$^3$.

Thus, in the present invention, the starting materials, composition ratio, production conditions, and the like of the amorphous oxide are controlled as in the individual examples described below so as to adjust the electron carrier concentration to 10$^{12}$/cm$^3$ or more but less than 10$^{18}$/cm$^3$. Preferably, the electron carrier concentration is adjusted to 10$^{13}$/cm$^3$ to 10$^{17}$/cm$^3$, and more preferably 10$^{15}$/cm$^3$ to 10$^{16}$/cm$^3$.

The electron mobility is preferably 0.1 cm$^2$/(V·sec) or more, more preferably 1 cm$^2$/(V·sec) or more, and most preferably 5 cm$^2$/(V·sec) or more when measured at room temperature. The amorphous oxide exhibits increased electron mobility as the electron carrier concentration increases. The conductivity thereof tends to exhibit degenerate conduction. Degenerate conduction is defined as a state in which the thermal activation energy for temperature dependency of electrical resistance is 30 meV or less.

(Starting Materials for Amorphous Oxide)

The amorphous oxide of the present invention contains at least one element selected from Zn, In, and Sn as a constituent component and is represented by [(Sn$_{1-x}$M4$_x$)O$_2$]a·[(In$_{1-y}$M3$_y$)$_2$O$_3$]b·[(Zn$_{1-z}$M2$_z$)O]c [0≤x≤1, 0≤y≤1, 0≤z≤1; x, y, and z are not simultaneously 1; 0≤a≤1, 0≤b≤1, 0≤c≤1, and a+b+c=1; M4 is a group IV element (Si, Ge, or Zr) having an atomic number smaller than that of Sn; M3 is Lu or a group III element (B, Al, Ga, or Y) having an atomic number smaller than that of In and M2 is a group II element (Mg or Ca) having an atomic number smaller than that of Zn. The amorphous oxide may further contain at least one element selected from group V elements M5 (V, Nb, and Ta) and W. In this description, the group II, III, IV, and V elements in the periodic table are sometimes referred to as group 2, 3, 4, and 5 elements, respectively; however, the meaning is the same.

The electron carrier concentration can be further decreased by adding at least one element that can form a compound oxide, the at least one element being selected from a group 2 element M2 (M2: Mg or Ca) having an atomic number smaller than that of Zn; Lu and a group 3 element M3 (M3: B, Al, Ga, or Y) having an atomic number smaller than that of In; a group 4 element M4 (M4: Si, Ge, or Zr) having an atomic number smaller than that of Sn; and a group 5 element M5 (M5: V, Nb, and Ta) or W.

The elements M2, M3, and M4 having atomic numbers smaller than those of Zn, In, and Sn, respectively, have higher ionicity than Zn, In and Sn; thus, generation of oxygen defects is less frequent, and the electron carrier concentration can be decreased. Although Lu has a larger atomic number than Ga, the ion radius is small and the ionicity is high, thereby achieving the same functions as those of M3. M5, which is ionized at a valency of 5, strongly bonds to oxygen and rarely causes oxygen defects. Tungsten (W), which is ionized at a valency of 6, strongly bonds to oxygen and rarely causes oxygen defects.

The amorphous oxide applicable to the present invention is a single compound having a composition in a crystallized state represented by $[(In_{1-y}M3_y)_2O_3(Zn_{1-x}M2_x)O]_m$ (wherein $0 \leq x \leq 1$; $0 \leq y \leq 1$; x and y are not simultaneously 1; m is zero or a number or a natural number less than 6; M3 is Lu or a group 3 element (B, Al, Ga, or Y) having an atomic number smaller than that of In; and M2 is a group 2 element (Mg or Ca) having an atomic number smaller than that of Zn] or a mixture of compounds with different values of m. M3 is, for example, Ga. M2 is, for example, Mg.

The amorphous oxide applicable to the present invention is a unitary, binary, or ternary compound within a triangle with apexes of $SnO_2$, $In_2O_3$, and ZnO. Among these three compounds, $In_2O_3$ has high amorphous formation capacity and can form a completely amorphous phase when $In_2O_3$ is deposited by a vapor phase method while adding approximately 0.1 Pa of water into the atmosphere.

ZnO and $SnO_2$ in some cases do not form an amorphous phase by themselves; however, they can form an amorphous phase in the presence of $In_2O_3$ as a host oxide. In particular, of binary compositions containing two of the above-described three compounds (compositions located on the side of the triangle), the In—Zn—O system can form an amorphous film when In is contained in an amount of about 20 at % or more, and the Sn—In—O system can form an amorphous film when In is contained in an amount of about 80 at % or more by a vapor phase method.

In order to obtain an In—Zn—O amorphous film by a vapor phase method, about 0.1 Pa of steam may be introduced into the atmosphere. In order to obtain an In—Sn—O-system amorphous film by a vapor phase method, about 0.1 Pa of nitrogen gas may be introduced into the atmosphere. For the ternary composition, Sn—In—Zn, containing the three compounds, an amorphous film can be obtained by a vapor phase method when In is contained in an amount of about 15 at % in the above-described composition range. Note that "at %" herein indicates atomic percent with respect to the metal ions other than oxygen ions. In particular, for example, "the In—Zn—O system containing about 20 at % or more of In" is equivalent to $In_xZn_{1-x}$ ($x > 0.2$).

The composition of the amorphous oxide film containing Sn, In, and/or Zn may contain additional elements as described below. In particular, at least one element that forms a compound oxide, the at least one element being selected from a group 2 element M2 (M2: Mg or Ca) having an atomic number smaller than that of Zn, Lu or a group 3 element M3 (M3: B, Al, Ga, or Y) having an atomic number smaller than that of In, and a group 4 element M4 (M4: Si, Ge, or Zr) having an atomic number smaller than that of Sn may be added. The amorphous oxide film of the present invention may further contain at least one element that can form a compound oxide, the at least one element being selected from group 5 elements (M5: V, Nb, and Ta) and W.

Addition of the above-described elements will increase the stability of the amorphous film and expands the composition range that can give an amorphous film. In particular, addition of highly covalent B, Si, or Ge is effective for stabilization of the amorphous phase, and a compound oxide composed of ions with largely different ion radii can stabilize the amorphous phase. For example, in the In—Zn—O system, a stable amorphous film is rarely obtained at room temperature unless the range of In content is more than about 20 at %. However, by adding Mg in an equivalent amount to In, a stable amorphous film can be obtained at an In content of more than about 15 at %.

An example of the amorphous oxide material that can be used in the channel layer of the TFT of the present invention is described next. The amorphous oxide that can be used in the channel layer is, for example, an oxide that contains In, Ga, and Zn at an atomic ratio satisfying In:Ga:Zn=1:1:m, wherein m is a value less than 6. The value of m may be a natural number but is not necessarily a natural number. This applies to "m" referred to in other sections of this description. The atomic ratio can be considered as equivalent to a molar ratio.

A transparent amorphous oxide thin film whose composition in a crystallized state is represented by $InGaO_3(ZnO)_m$ (wherein m is a number less than 6) maintains a stable amorphous state at high temperatures not less than 800° C. when the value of m is less than 6. However, as the value of m increases, i.e., as the ratio of ZnO to $InGaO_3$ increases and the composition approaches to the ZnO composition, the composition tends to be more crystallizable. Thus, the value of m is preferably less than 6 for the channel layer of the amorphous TFT. A desired amorphous oxide can be obtained by adjusting the composition of the target material (e.g., a polycrystalline material) for deposition, such as sputtering deposition or pulsed laser deposition (PLD), to comply with m<6.

In the amorphous oxide described above, Zn in the composition ratio of InGaZn may be replaced by $Zn_{1-x}Mg_x$. The possible amount of Mg for replacement is within the range of $0 < x \leq 1$. When the replacement with Mg is conducted, the electron mobility of the oxide film decreases compared to a film containing no Mg. However, the extent of decrease is small, and the electron carrier concentration can be decreased compared to when no replacement is conducted. Thus, this is more preferable for the channel layer of a TFT. The amount of Mg for replacement is preferably more than 20% and less than 85% ($0.2 < x < 0.85$ in term of x) and more preferably $0.5 < x < 0.85$.

The amorphous oxide may be appropriately selected from In oxides, $In_xZn_{1-x}$ oxides ($0.2 \leq x \leq 1$), $In_xSn_{1-x}$ oxides ($0.8 \leq x \leq 1$), and $In_x(Zn, Sn)_{1-x}$ oxides ($0.15 \leq x \leq 1$). The ratio of Zn to Sn in the $In_x(Zn, Sn)_{1-x}$ oxides may be appropriately selected. Namely, an $In_x(Zn, Sn)_{1-x}$ oxide can be described as $In_x(Zn_ySn_{1-y})_{1-x}$ oxide, and y is in the range of 1 to 0. For an In oxide containing neither Zn nor Sn, In may be partly replaced by Ga. In this case, the oxide can be described as an $In_xGa_{1-x}$ oxide ($0 \leq x \leq 1$).

(Method for Producing Amorphous Oxide)

The amorphous oxide used in the present invention can be prepared by a vapor phase deposition technique under the conditions indicated in the individual examples below. For example, in order to obtain an InGaZn amorphous oxide, deposition is conducted by a vapor phase method such as a sputtering (SP) method, a pulsed laser deposition (PLD) method, or an electron beam deposition method while using a polycrystalline sinter represented by $InGaO_3(ZnO)_m$ as the target. From the standpoint of mass productivity, the sputtering method is most suitable.

During the formation of an $In_2O_3$ or In—Zn—O amorphous oxide film or the like, oxygen radicals may be added to the atmosphere. Oxygen radicals may be added through an oxygen radical generator. When there is need to increase the electron carrier concentration after the film formation, the film is heated in a reducing atmosphere to increase the electron carrier concentration. The resulting amorphous oxide film with a different electron carrier concentration was analyzed to determine the dependency of the electron mobility on the electron carrier concentration, and the electron mobility increased with the electron carrier concentration.

(Substrate)

The substrate for forming the TFT of the present invention may be a glass substrate, a plastic substrate, a plastic film, or the like. Moreover, as described below in EXAMPLES, the amorphous oxide of the present invention can be formed into a film at room temperature. Thus, a TFT can be formed on a flexible material such as a PET film. Moreover, the above-mentioned amorphous oxide may be appropriately selected to prepare a TFT from a material that is transparent in visible light not less than 400 nm or infrared light.

(Gate insulating film)

The gate insulating film of the TFT of the present invention is preferably a gate insulating film composed of $Al_2O_3$, $Y_2O_3$, $HfO_2$, or a mixed crystal compound containing at least two of these compounds. When there is a defect at the interface between the gate insulating thin film and the channel layer thin film, the electron mobility decreases and hysteresis occurs in the transistor characteristics. Moreover, leak current greatly differs according to the type of the gate insulating film. Therefore, a gate insulating film suitable for the channel layer must be selected.

Use of an $Al_2O_3$ film can decrease the leak current. Use of an $Y_2O_3$ film can reduce the hysteresis. Use of a high dielectric constant $HfO_2$ film can increase the field effect mobility. By using a film composed of a mixed crystal of these compounds, a TFT having small leak current and hysteresis and large field effect mobility can be produced. the process for forming the gate insulating film and the process for forming the channel layer can be conducted at room temperature; thus, a TFT of a staggered or inverted staggered structure can be formed.

(Transistor)

When a field effect transistor includes a channel layer composed of an amorphous oxide film having an electron carrier concentration of less than $10^{18}/cm^3$, a source terminal, a drain terminal, and a gate terminal disposed on the gate insulating film, the current between the source and drain terminals can be adjusted to about $10^{-7}$ A when a voltage of about 5V is applied between the source and drain terminals without application of a gate voltage. The theoretical lower limit of the electron carrier concentration is $10^5/cm^3$ or less assuming that the electrons in the valence band are thermally excited. The actual possibility is that the lower limit is about $10^{12}/cm^3$.

When $Al_2O_3$, $Y_2O_3$, or $HfO_2$ alone or a mixed crystal compound containing at least two of these compounds is used in the gate insulating layer, the leak voltage between the source gate terminals and the leak voltage between the drain and gate terminals can be adjusted to about $10^{-7}$ A, and a normally off transistor can be realized.

The electron mobility of the oxide crystals increases as the overlap of the s orbits of the metal ion increases. The oxide crystals of Zn, In, and Sn having large atomic numbers exhibit high electron mobility of 0.1 to 200 $cm^2/(V \cdot sec)$. Since ionic bonds are formed between oxygen and metal ions in an oxide, electron mobility substantially comparable to that in a crystallized state can be exhibited in an amorphous state in which there is no directionality of chemical bonding, the structure is random, and the directions of the bonding are nonuniform. In contrast, by replacing Zn, In, and Sn each with an element having a smaller atomic number, the electron mobility can be decreased. Thus, by using the amorphous oxide described above, the electron mobility can be controlled within the range of about 0.01 $cm^2/(V \cdot sec)$ to 20 $cm^2/(V \cdot sec)$.

In a typical compound, the electron mobility decreases as the carrier concentration increases due to the dispersion between the carriers. In contrast, the amorphous oxide of the present invention exhibits increased electron mobility with the increasing electron carrier concentration. The physical principle that lies behind this phenomenon is not clearly identified.

Once a voltage is applied to the gate terminal, electrons are injected into the amorphous oxide channel layer, and current flows between the source and drain terminals, thereby allowing the part between the source and drain terminals to enter an ON state. According to the amorphous oxide film of the present invention, since the electron mobility increases with the electron carrier concentration, the current that flows when the transistor is turned ON can be further increased. In other words, the saturation current and the on/off ratio can be further increased. When the amorphous oxide film having high electron mobility is used as the channel layer of a TFT, the saturation current can be increased and the switching rate of the TFT can be increased, thereby achieving high-speed operation.

For example, when the electron mobility is about 0.01 $cm^2/(V \cdot sec)$, the material can be used in a channel layer of a TFT for driving a liquid crystal display element. By using an amorphous oxide film having an electron mobility of about 0.1 $cm^2/(V \cdot sec)$, a TFT that has performance comparable or superior to the TFT using an amorphous silicon film and that can drive a display element for moving images can be produced.

In order to realize a TFT that requires large current, e.g., for driving a current-driven organic light-emitting diode, the electron mobility is preferably more than 1 $cm^2/(V \cdot sec)$. Note than when the amorphous oxide of the present invention that exhibits degenerate conduction is used in the channel layer, the current that flows at a high carrier concentration, i.e., the saturation current of the transistor, shows decreased dependency on temperature, and a TFT with superior temperature characteristics can be realized.

EXAMPLES

Example 1

Preparation of Amorphous In—Ga—Zn—O Thin Film by PLD Method

Figure 7:
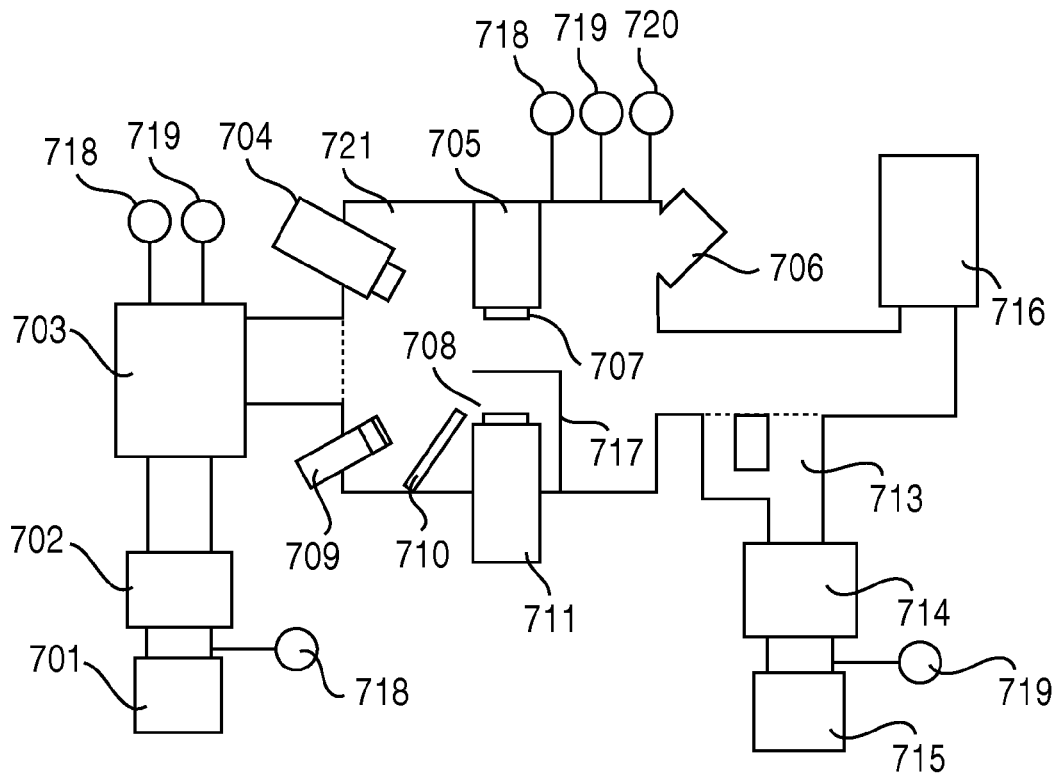
FIG. 7 is a schematic illustration showing a pulsed layer deposition device.

A film was formed in a PLD device shown in FIG. 7. In the drawing, reference numeral 701 denotes a rotary pump (RP), 702 denotes a turbo molecular pump (TMP), 703 denotes a preparation chamber, 704 denotes en electron gun for RHEED, 705 denotes a substrate holder for rotating and vertically moving the substrate, 706 denotes a laser entrance window, 707 denotes a substrate, 708 denotes a target, 709 denotes a radical source, 710 denotes a gas inlet, 711 denotes a target holder for rotating and vertically moving the target, 712 denotes a by-pass line, 713 denotes a main line, 714 denotes a turbo molecular pump (TMP), 715 denotes a rotary pump (RP), 716 denotes a titanium getter pump, and 717 denotes a shutter. In the drawing, 718 denotes ionization gauge (IG), 719 denotes a Pirani gauge (PG), 720 denotes a Baratron gauge (BG), and 721 denotes a deposition chamber.

An In—Ga—Zn—O amorphous oxide semiconductor thin film was formed on a $SiO_2$ glass substrate (#1737 produced by Corning) by a pulsed laser deposition method using a KrF excimer laser. As the pre-deposition treatment, the substrate was degreased with ultrasonic waves in acetone, ethanol, and ultrapure water for 5 minutes each, and then dried in air at 100° C.

An $InGaO_3(ZnO)_4$ sinter target (size: 20 mm in dia., 5 mm in thickness) was used as the polycrystalline target. This target was prepared by wet-mixing the starting materials, $In_2O_3$:$Ga_2O_3$:ZnO (each being a 4N reagent), in a solvent (ethanol), calcining (1000° C., 2 h) the resulting mixture, dry-milling the calcined mixture, and sintering the resulting mixture (1550° C., 2 h). The electrical conductivity of the target obtained was 90 (S/cm).

The ultimate vacuum of the deposition chamber was adjusted to $2 \times 10^{-6}$ (Pa), and the oxygen partial pressure during the deposition was controlled to 6.5 (Pa) to form a film. The oxygen partial pressure inside the chamber 721 was 6.5 Pa, and the substrate temperature was 25° C. The distance between the target 708 and the substrate 707 for deposition was 30 (mm). The power of the KrF excimer laser entering from the entrance window 716 was in the range of 1.5 to 3 (mJ/cm$^2$/pulse). The pulse width was 20 (nsec), the repetition frequency was 10 (Hz), and the beam spot diameter was 1×1 (mm square). A film was formed at a deposition rate of 7 (nm/min).

The resulting thin film was subjected to grazing incidence x-ray diffraction (thin film method, incident angle: 0.5°), but no clear diffraction peak was observed. Thus, the In—Ga—Zn—O thin film obtained was assumed to be amorphous. The X-ray reflectance was determined, and the pattern was analyzed. It was observed that the root mean square roughness (Rrms) of the thin film was about 0.5 nm, and the film thickness was about 120 nm. The results of the fluorescence X-ray showed that the metal composition ratio of the thin film was In:Ga:Zn=0.98:1.02:4. The electrical conductivity was less than about $10^{-2}$ S/cm. The electron carrier concentration and the electron mobility were presumably about $10^{16}$/cm$^3$ or less and about 5 cm$^2$/(V·sec), respectively.

Based on the analysis of the optical absorption spectrum, the energy width of the forbidden band of the amorphous thin film prepared was determined to be about 3 eV. Based on these values, it was found that the In—Ga—Zn—O thin film had an amorphous phase close to the composition of the crystals of $InGaO_3(ZnO)_4$, had fewer oxygen defects, and was a flat, transparent thin film with low electrical conductivity.

Figure 1:
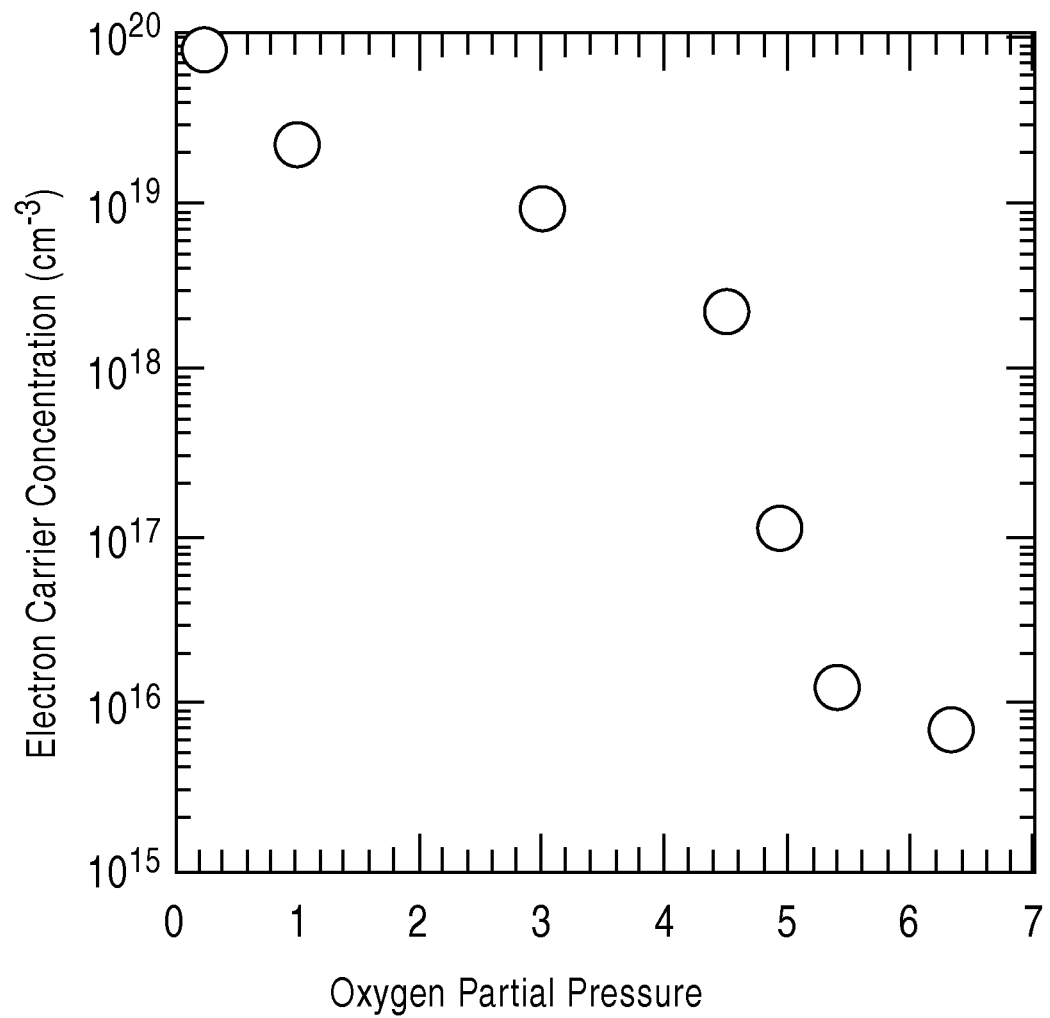
FIG. 1 is a graph that shows the relationship between the oxygen partial pressure during the deposition and the electron carrier concentration of an In—Ga—Zn—O amorphous oxide deposited by a pulsed laser deposition method.

Specific description is now presented with reference to FIG. 1. FIG. 1 shows a change in electron carrier concentration of the oxide formed into a film against changes in oxygen partial pressure when an In—Ga—Zn—O transparent amorphous oxide thin film represented by $InGaO_3(ZnO)_4$ in an assumed crystal state is formed under the same conditions as in this EXAMPLE.

As shown in FIG. 1, the electron carrier concentration decreased to less than $10^{18}$/cm$^3$ when the film was formed in an atmosphere at a high oxygen partial pressure of more than 4.5 Pa under the same conditions as this example. In this case, the temperature of the substrate was maintained substantially at room temperature without intentional heating. The substrate temperature is preferably less than 100° C. when a flexible plastic film is used as the substrate.

By further increasing the oxygen partial pressure, the electron carrier concentration was further decreased. For example, as shown in FIG. 1, the number of the electron carriers of the $InGaO_3(ZnO)_4$ thin film deposited at a substrate temperature of 25° C. and an oxygen partial pressure of 5 Pa decreased to $10^{16}$/cm$^3$.

Figure 2:
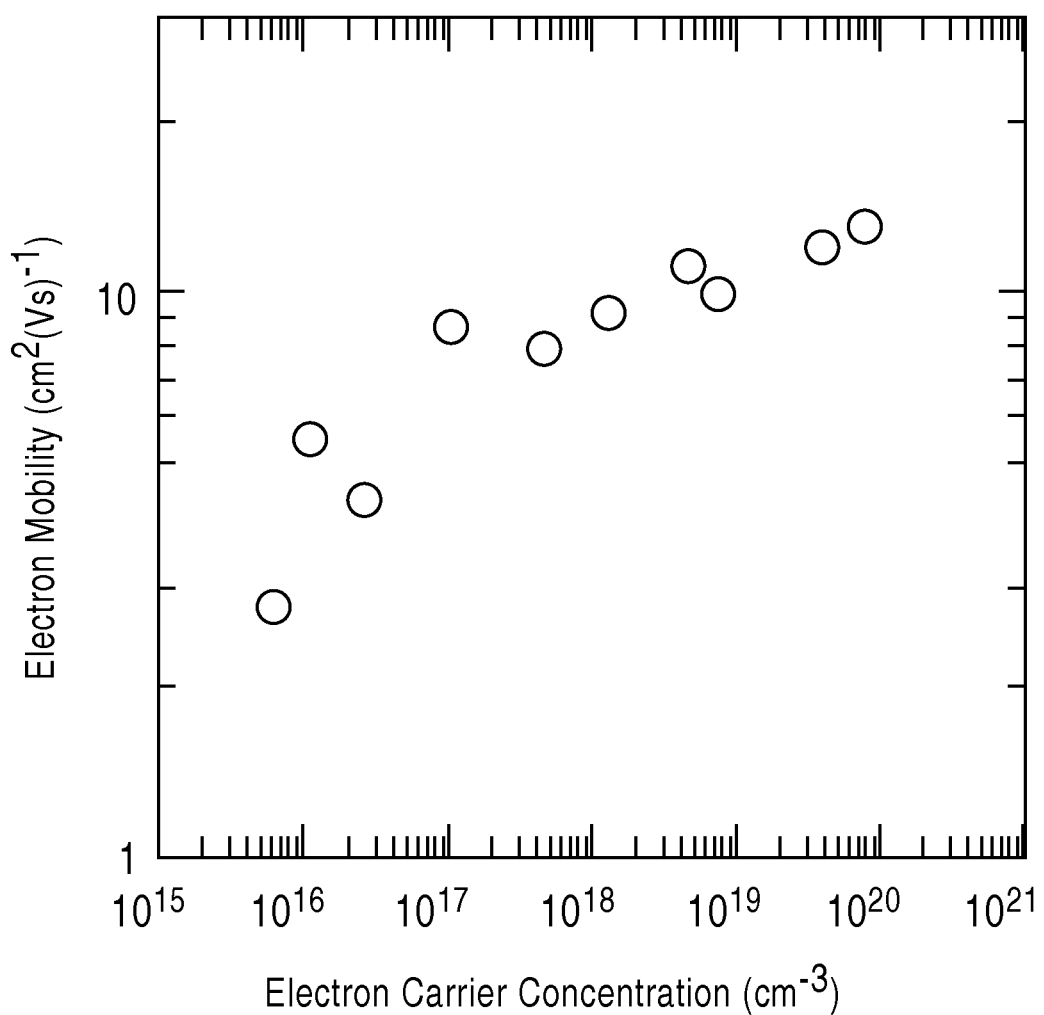
FIG. 2 is a graph that shows the relationship between the electron carrier concentration and electron mobility of an In—Ga—Zn—O amorphous oxide film formed by a pulsed laser deposition method.

The thin film obtained had an electron mobility exceeding 1 cm$^2$/(V·sec), as shown in FIG. 2. However, according to the pulsed laser deposition method of the present invention, the surface of the film deposited will have irregularities at an oxygen partial pressure of 6.5 Pa or more, and thus, the it is difficult to use the thin film as a channel layer of a TFT. Therefore, by using an In—Ga—Zn—O transparent amorphous oxide thin film having a composition of $InGaO_3(ZnO)_m$ (m is less than 6) in a crystal state prepared by a pulsed laser deposition method in an atmosphere having an oxygen partial pressure exceeding 4.5 Pa, preferably exceeding 5 Pa, but less than 6.5 Pa, a normally off transistor can be prepared.

The electron mobility of this thin film was more than 1 cm$^2$/(V·sec), and the on/off ratio thereof was increased to over $10^3$. As is described above, in forming an InGaZn oxide film by a PLD method under the conditions set forth in this example, the oxygen partial pressure is preferably controlled to not less than 4.5 Pa but less than 6.5 Pa. Whether an electron carrier concentration of $10^{18}$/cm$^3$ is realized depends on the conditions of the oxygen partial pressure, the configuration of the deposition device, the materials for deposition, the composition, and the like.

Example 2

Formation of Amorphous $InGaO_3(ZnO)$ and $InGaO_3(ZnO)_4$ Oxide Films by PLD Method In—Zn—Ga—O amorphous oxide films were deposited on glass substrates (#1737 produced by Corning) by using polycrystalline sinters represented by $InGaO_3(ZnO)$ and $InGaO_3(ZnO)_4$ as the targets by a PLD method using KrF excimer laser. The same PLD deposition device as shown in EXAMPLE 1 was used, and the deposition was conducted under the same conditions. The substrate temperature during the deposition was 25° C.

Each film obtained thereby was subjected to grazing incidence x-ray diffraction (thin film method, incident angle: 0.5°) for the film surface. No clear diffraction peak was detected. The In—Zn—Ga—O films prepared from the two targets were both amorphous.

The In—Zn—Ga—O amorphous oxide films on the glass substrates were each analyzed to determine the x-ray reflectance. Analysis of the pattern found that the root mean average roughness (Rrms) of the thin film was about 0.5 mm and that the thickness was about 120 nm. Fluorescence x-ray analysis (XRF) showed that the ratio of the metal atoms of the film obtained from the target composed of the polycrystalline sinter represented by $InGaO_3(ZnO)$ was In:Ga:Zn=1.1:1.1:0.9 and that the ratio of the metal atoms of the film obtained from the target composed of the polycrystalline sinter represented by $InGaO_3(ZnO)_4$ was In:Ga:Zn=0.98:1.02:4.

The electron carrier concentration of the amorphous oxide film obtained from the target composed of the polycrystalline sinter represented by $InGaO_3(ZnO)_4$ was measured while changing the oxygen partial pressure of the atmosphere during the deposition. The results are shown in FIG. 1. By forming the film in the atmosphere having an oxygen partial pressure exceeding 4.5 Pa, the electron carrier concentration could be decreased to less than $10^{18}/cm^3$. In this case, the temperature of the substrate was maintained substantially at room temperature without intentional heating. When the oxygen partial pressure was less than 6.5 Pa, the surface of the amorphous oxide film obtained was flat.

When the oxygen partial pressure was 5 Pa, the electron carrier concentration and the electrical conductivity of the amorphous oxide film obtained from the target composed of the polycrystalline sinter represented by $InGaO_3(ZnO)_4$ were $10^{16}/cm^3$ and $10^{-2}$ S/cm, respectively. The electron mobility was presumably about 5 $cm^2/(V \cdot sec)$. Based on the analysis of the optical absorption spectrum, the energy width of the forbidden band of the amorphous thin film prepared was determined to be about 3 eV. The electron carrier concentration could be further decreased as the oxygen partial pressure was increased from 5 Pa.

As shown in FIG. 1, the In—Zn—Ga—O amorphous oxide film deposited at a substrate temperature of 25° C. and an oxygen partial pressure of 6 Pa exhibited a decreased electron carrier concentration of $8 \times 10^{15}/cm^3$ (electrical conductivity: about $8 \times 10^{-3}$ S/cm). The resulting film was assumed to have an electron mobility of more than 1 $cm^2/(V \cdot sec)$. However, according to the PLD method, irregularities were formed in the surface of the film deposited at an oxygen partial pressure of 6.5 Pa or more, and thus it was difficult to use the film as the channel layer of the TFT.

The relationship between the electron carrier concentration and the electron mobility of the In—Zn—Ga—O amorphous oxide film prepared from the target composed of the polycrystalline sinter represented by $InGaO_3(ZnO)_4$ at different oxygen partial pressures was investigated. The results are shown in Table 2. When the electron carrier concentration increased from $10^{16}/cm^3$ to $10^{20}/cm^3$, the electron mobility increased from about 3 $cm^2/(V \cdot sec)$ to about 11 $cm^2/(V \cdot sec)$. The same tendency was observed for the amorphous oxide film prepared from the target composed of the polycrystalline sinter represented by $InGaO_3(ZnO)$.

An In—Zn—Ga—O amorphous oxide film formed on a polyethylene terephthalate (PET) film having a thickness of 200 μm instead of the glass substrate also showed similar characteristics.

Example 3

Formation of In—Zn—Ga—O Amorphous Oxide Film by SP Method

Figure 8:
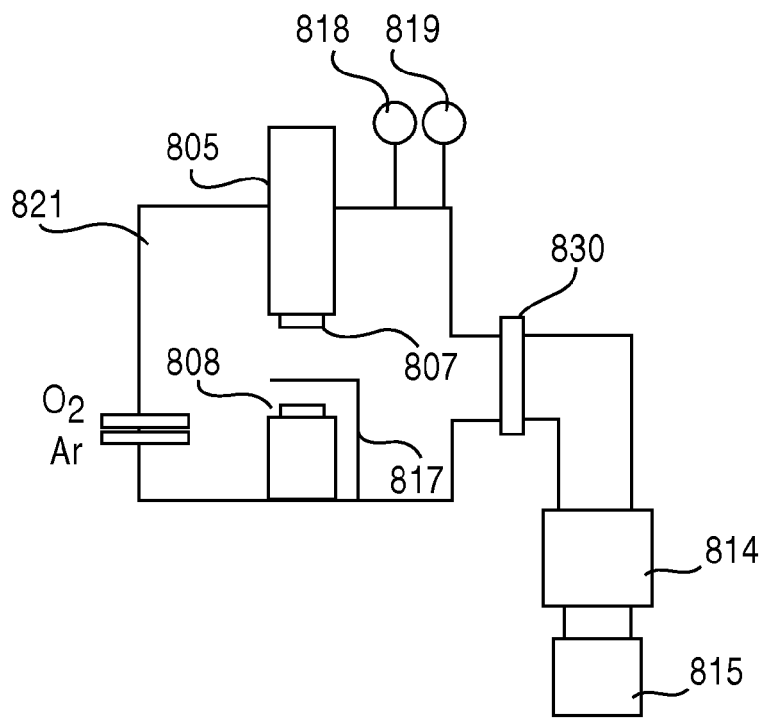
FIG. 8 is a schematic illustration showing a sputter deposition device.

Formation of a film by a high-frequency SP method using argon gas as the atmosphere gas is described. The SP method was conducted using the device shown in FIG. 8. In the drawing, reference numeral 807 denotes a substrate for deposition, 808 denotes a target, 805 denotes a substrate holder equipped with a cooling mechanism, 814 denotes a turbo molecular pump, 815 denotes a rotary pump, 817 denotes a shutter, 818 denotes an ionization gauge, 819 denotes a Pirani gauge, 821 denotes a deposition chamber, and 830 denotes a gate valve. A $SiO_2$ glass substrate (#1737 produced by Corning) was used as the substrate 807 for deposition. As the pre-deposition treatment, the substrate was degreased with ultrasonic waves in acetone, ethanol, and ultrapure water for 5 minutes each, and then dried in air at 100° C.

An $InGaO_3(ZnO)_4$ polycrystalline sinter (size: 20 mm in dia., 5 mm in thickness) was used as the target material. The sinter was prepared by wet-mixing the starting materials, $In_2O_3:Ga_2O_3:ZnO$ (each being a 4N reagent), in a solvent (ethanol), calcining (1000° C., 2 h) the resulting mixture, dry-milling the calcined mixture, and sintering the resulting mixture (1550° C., 2 h). The target 808 had an electrical conductivity of 90 (S/cm) and was in a semi-insulating state.

The ultimate vacuum inside the deposition chamber 821 was $1 \times 10^{-4}$ (Pa). The total pressure of the oxygen gas and the argon gas during the deposition was controlled at a predetermined value within the range of 4 to $0.1 \times 10^{-1}$ (Pa), and the oxygen partial pressure was changed in the range of $10^{-3}$ to $2 \times 10^{-1}$ (Pa) by changing the partial pressure ratio of the argon gas and oxygen. The substrate temperature was room temperature, and the distance between the target 808 and the substrate 807 for deposition was (mm). The current injected was RF 180 W, and the deposition rate was 10 (nm/min).

The resulting film was subjected to grazing incidence x-ray diffraction (thin film method, incident angle=0.5°) for the film surface, but no clear diffraction peak was observed. Thus, the In—Zn—Ga—O thin film obtained was proved to be amorphous. The X-ray reflectance was determined, and the pattern was analyzed. It was observed that the root mean square roughness (Rrms) of the thin film was about 0.5 nm, and the film thickness was about 120 nm. The results of the fluorescence X-ray showed that the metal composition ratio of the thin film was In:Ga:Zn=0.98:1.02:4.

Figure 3:
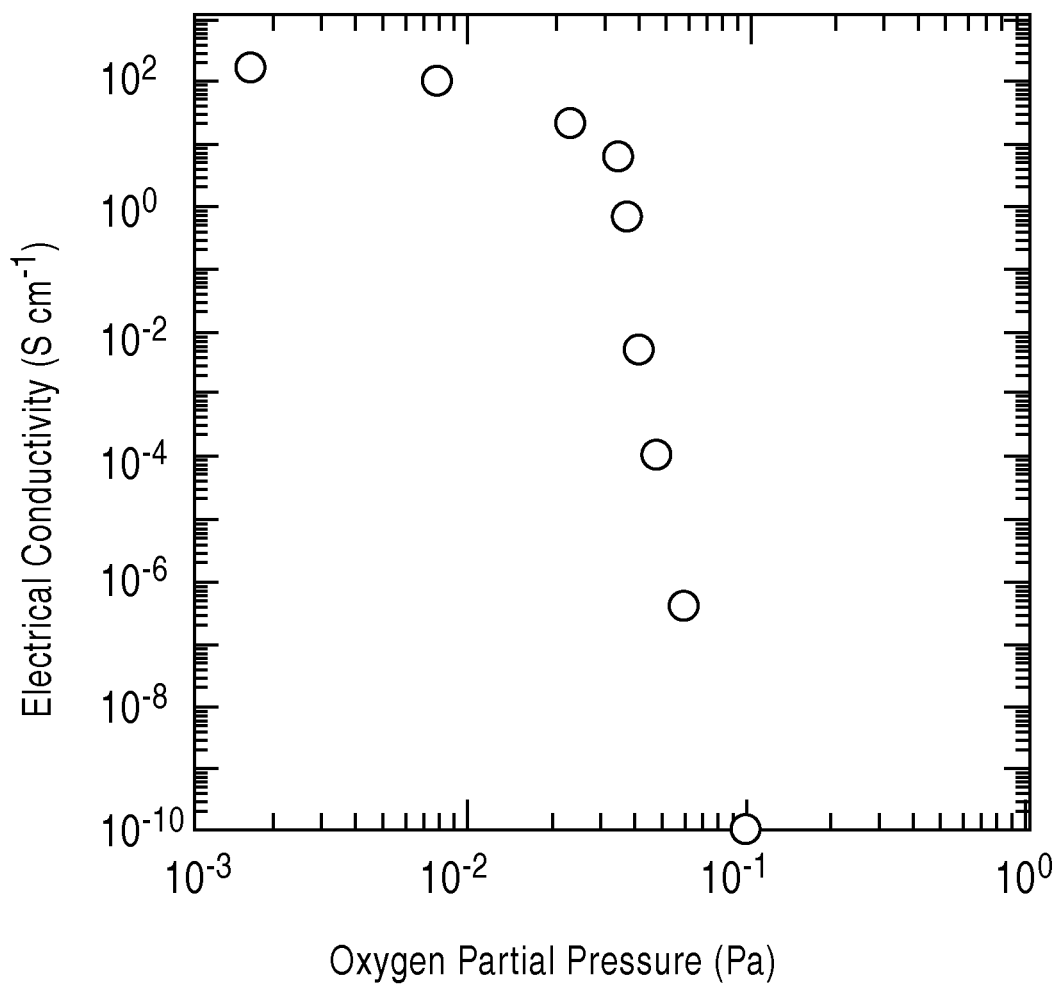
FIG. 3 is a graph that shows the relationship between the oxygen partial pressure during the deposition and the electrical conductivity of an In—Ga—Zn—O amorphous oxide deposited by a high-frequency sputtering method.

The electrical conductivity of the amorphous oxide film obtained by changing the oxygen partial pressure in the atmosphere during the deposition was measured. The results are shown in FIG. 3. As shown in FIG. 3, the electrical conductivity could be decreased to less than 10 S/cm by forming the film in an atmosphere at a high oxygen partial pressure exceeding $3 \times 10^{-2}$ Pa.

By further increasing the oxygen partial pressure, the number of electron carriers could be decreased. For example, as shown in FIG. 3, the electrical conductivity of an $InGaO_3(ZnO)_4$ thin film deposited at a substrate temperature of 25° C. and an oxygen partial pressure of $10^{-1}$ Pa was decreased to about $10^{-10}$ S/cm. An $InGaO_3(ZnO)_4$ thin film deposited at an oxygen partial pressure exceeding $10^{-1}$ Pa had excessively high electrical resistance and thus the electrical conductivity thereof could not be measured. However, extrapolation was conducted for the value observed from a film having a high electron carrier concentration, and the electron mobility was assumed to be about 1 $cm^2/(V \cdot sec)$.

In short, a normally off transistor having an on/off ratio exceeding $10^3$ could be made by using a transparent amorphous oxide thin film which was composed of In—Ga—Zn—O prepared by a sputter deposition method in argon gas atmosphere at an oxygen partial pressure more than $3 \times 10^{-2}$ Pa, preferably more than $5 \times 10^{-1}$ Pa, and which was represented by $InGaO_3(ZnO)_4$ (m is a natural number less than 6) in a crystallized state.

When the device and starting materials set forth in this example are used, the oxygen partial pressure during the sputter deposition is, for example, in the range of $3 \times 10^{-2}$ Pa to $5 \times 10^{-1}$ Pa. The electron mobility of the thin films prepared by the pulsed laser deposition method and the sputtering method increases with the number of the conduction electrons, as shown in FIG. 2.

As described above, by controlling the oxygen partial pressure, oxygen defects can be reduced, and therefore the electron carrier concentration can be reduced. Unlike in the polycrystalline state, in the amorphous state, there is essentially no grain interface; therefore, an amorphous thin film with high electron mobility can be obtained. Note that when a polyethylene terephthalate (PET) film having a thickness of 200 μm was used instead of the glass substrate, the resulting InGaO$_3$(ZnO)$_4$ amorphous oxide thin film exhibited similar characteristics.

Example 4

Formation of In—Zn—Ga—Mg—O Amorphous Oxide Film by PLD Method

Formation of an InGaO$_3$(Zn$_{1-x}$Mg$_x$O)$_4$ film (0<x<1) on a glass substrate by a PLD method is described. The same deposition device shown in FIG. 7 was used as the deposition device. A SiO$_2$ glass substrate (#1737 produced by Corning) was prepared as the substrate for deposition. As the pre-deposition treatment, the substrate was degreased with ultrasonic waves in acetone, ethanol, and ultrapure water for 5 minutes each, and then dried in air at 100° C.

An InGa(Zn$_{1-x}$Mg$_x$O)$_4$ (0<x<1) sinter (size: 20 mm in dia., 5 mm in thickness) was used as the target. The target was prepared by wet-mixing the starting materials, In$_2$O$_3$:Ga$_2$O$_3$:ZnO:MgO (each being a 4N reagent), in a solvent (ethanol), calcining (1000° C., 2 h) the resulting mixture, dry-milling the calcined mixture, and sintering the resulting mixture (1550° C., 2 h).

The ultimate vacuum inside the deposition chamber was 2×10$^{-6}$ (Pa), and the oxygen partial pressure during the deposition was 0.8 (Pa). The substrate temperature was room temperature (25° C.), and the distance between the target and the substrate for deposition was 30 (mm). The power of the KrF excimer laser was 1.5 (mJ/cm$^2$/pulse), the pulse width was 20 (nsec), the repetition frequency was 10 (Hz), and the beam spot diameter was 1×1 (mm square). The deposition rate was 7 (nm/min).

The resulting film was subjected to grazing incidence x-ray diffraction (thin film method, incident angle: 0.5°) for the film surface, but no clear diffraction peak was observed. Thus, the In—Zn—Ga—Mg—O thin film obtained was proved to be amorphous. The surface of the resulting film was flat.

The dependency on the value x of the electrical conductivity, electron carrier concentration, and electron mobility of In—Zn—Ga—Mg—O amorphous oxide films deposited in atmosphere at an oxygen partial pressure of 0.8 Pa was investigated by using targets of different x values. Note that a high-resistance amorphous InGaO$_3$(Zn$_{1-x}$Mg$_x$O)$_m$ film could be obtained at an oxygen partial pressure of less than 1 Pa as long as the polycrystalline InGaO$_3$(Zn$_{1-x}$Mg$_x$O)$_m$ (m is a natural number less than 6; 0<x≤1) was used as the target.

Figure 4A:
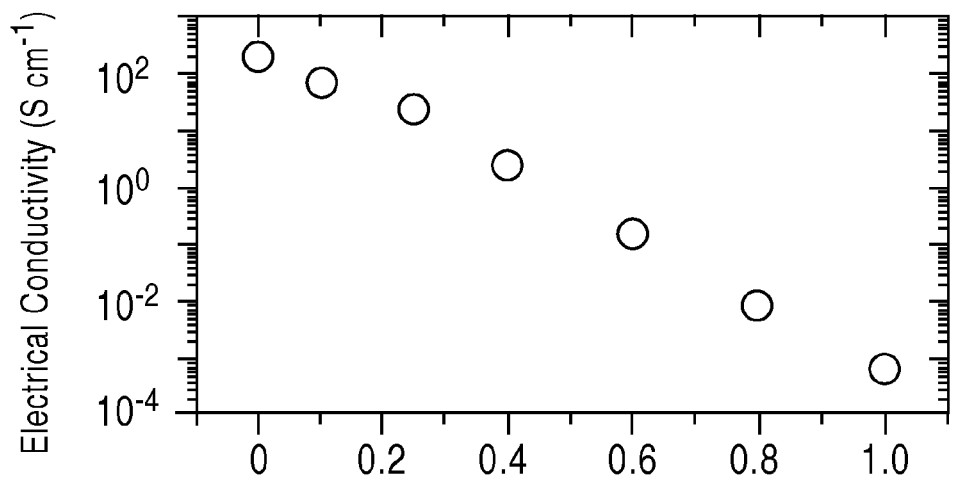
FIG. 4 is a graph showing changes in electron conductivity, electron carrier concentration, and electron mobility of InGaO$_3$(Zn$_{1-x}$Mg$_x$O)$_4$ deposited by pulsed laser deposition against x.
Figure 4B:
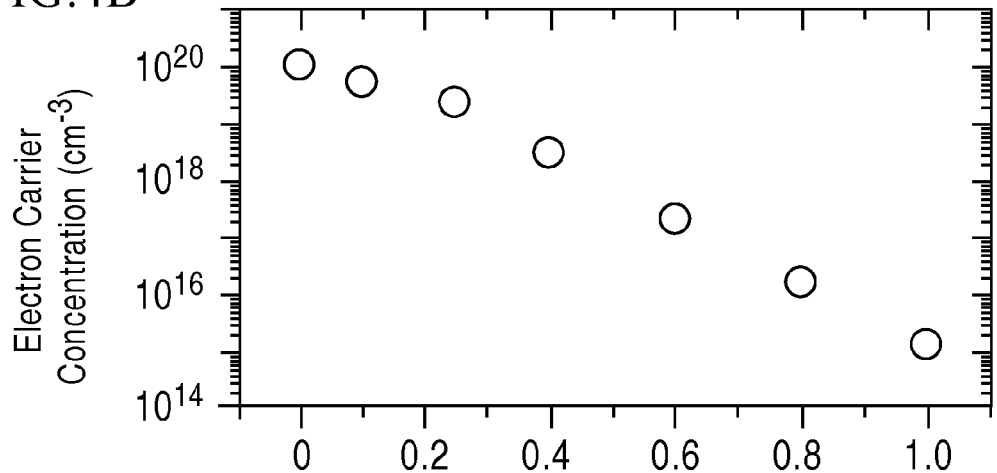
Figure 4C:
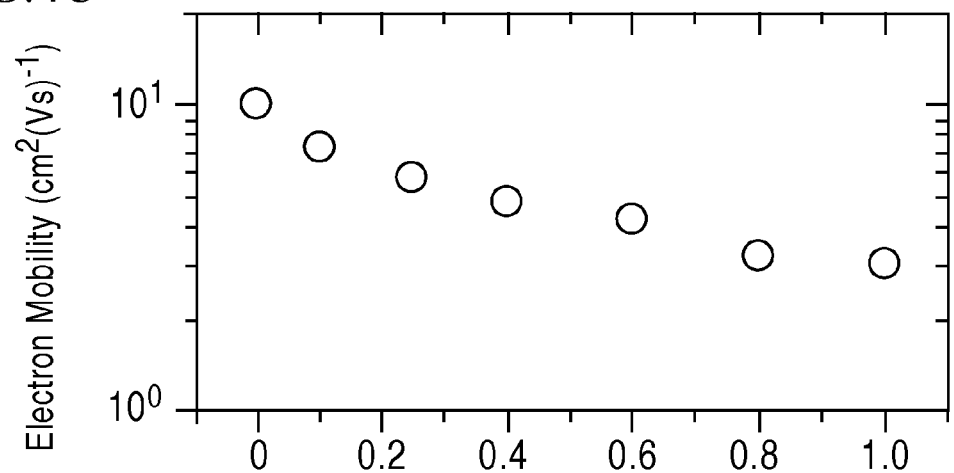

The results are shown in FIG. 4. The results showed that the electron carrier concentration of an amorphous oxide film deposited by a PLD method in an atmosphere at an oxygen partial pressure of 0.8 Pa could be reduced to less than 10$^{18}$/cm$^3$ when the value x was more than 0.4. The electron mobility of the amorphous oxide film with x exceeding 0.4 was more than 1 cm$^2$/(V·sec). As shown in FIG. 4, when a target in which Zn was substituted with 80 at % Mg was used, the electron carrier concentration of the film obtained by the pulsed laser deposition method in an atmosphere at an oxygen partial pressure of 0.8 Pa could be reduced to less than 10$^{16}$/cm$^3$.

Although the electron mobility of these films is low compared to that of Mg-free films, the degree of decrease is small, while the electron mobility at room temperature is about 5 cm$^2$/(V·sec), i.e., higher than that of amorphous silicon by one order of magnitude. When deposition is conducted under the same conditions, the electrical conductivity and the electron mobility both decrease with an increase in Mg content.

Thus, the Mg content is preferably more than 20 at % but less than 85 at % (0.2<x<0.85 in terms of x), and more preferably 0.5<x<0.85.

An InGaO$_3$(Zn$_{1-x}$Mg$_x$O)$_4$ (0<x<1) amorphous oxide film formed on a polyethylene terephthalate (PET) film having a thickness of 200 μm instead of the glass substrate also showed similar characteristics.

Example 5

Formation of In$_2$O$_3$ Amorphous Oxide Film by PLD

Formation of an indium oxide film is now described. The deposition device shown in FIG. 7 was used as the deposition device. A SiO$_2$ glass substrate (#1737 produced by Corning) was prepared as the substrate for deposition. As the pre-deposition treatment, the substrate was degreased with ultrasonic waves in acetone, ethanol, and ultrapure water for 5 minutes each, and then dried in air at 100° C.

An In$_2$O$_3$ sinter (size: 20 mm in dia., 5 mm in thickness) was used as the target. The target was prepared by calcining the starting material In$_2$O$_3$ (a 4N reagent) (1000° C., 2 h), dry milling the calcined material, and sintering the resulting material (1550° C., 2 h).

The ultimate vacuum inside the deposition chamber was 2×10$^{-6}$ (Pa), and the oxygen partial pressure during the deposition was 5 (Pa). The steam partial pressure was 0.1 (Pa), and 200 W was applied to the oxygen radical generator to produce oxygen radicals. The substrate temperature was room temperature. The distance between the target and the substrate for deposition was (mm). The power of the KrF excimer laser was 0.5 (mJ/cm$^2$/pulse), the pulse width was 20 (nsec), the repetition frequency was 10 (Hz), and the beam spot diameter was 1×1 (mm square). The deposition rate was 3 (nm/min).

The resulting film was subjected to grazing incidence x-ray diffraction (thin film method, incident angle: 0.5°) for the film surface, but no clear diffraction peak was observed. Thus, the In—O thin film obtained was proved to be amorphous. The film thickness was 80 nm. The electron carrier concentration and the electron mobility of the In—O amorphous oxide film obtained were 5×10$^{17}$/cm$^3$ and about 7 cm$^2$/(V·sec), respectively.

Example 6

Formation of In—Sn—O Amorphous Oxide Film by PLD

Deposition of an In—Sn—O amorphous oxide film having a thickness of 200 μm by a PLD method is described. A SiO$_2$ glass substrate (#1737 produced by Corning) was prepared as the substrate for deposition. As the pre-deposition treatment, the substrate was degreased with ultrasonic waves in acetone, ethanol, and ultrapure water for 5 minutes each, and then dried in air at 100° C.

An In$_2$O$_3$—SnO$_2$ sinter (size: 20 mm in dia., 5 mm in thickness) was prepared as the target by wet-mixing the starting materials, In$_2$O$_3$—SnO$_2$ (a 4N reagent), in a solvent (ethanol), calcining the resulting mixture (1000° C., 2 h), dry milling the calcined mixture, and sintering the resulting mixture (1550° C., 2 h). The composition of the target was (In$_{0.9}$Sn$_{0.1}$)$_2$O$_{3.1}$ polycrystal.

The ultimate vacuum inside the deposition chamber was 2×10$^{-6}$ (Pa), the oxygen partial pressure during the deposition was 5 (Pa), and the nitrogen partial pressure was 0.1 (Pa). Then 200 W is applied to the oxygen radical generator to produce oxygen radicals. The substrate temperature during the deposition was room temperature. The distance between the target and the substrate for deposition was 30 (mm). The power of the KrF excimer laser was 1.5 (mJ/cm$^2$/pulse), the pulse width was 20 (nsec), the repetition frequency was 10 (Hz), and the beam spot diameter was 1×1 (mm square).

The deposition rate was 6 (nm/min). The resulting film was subjected to grazing incidence x-ray diffraction (thin film method, incident angle: 0.5°) for the film surface, but no clear diffraction peak was observed. Thus, the In—Sn—O thin film obtained was proved to be amorphous. The electron carrier concentration and the electron mobility of the In—Sn—O amorphous oxide film obtained were 8×10$^{17}$/cm$^3$ and about 5 cm$^2$/(V·sec), respectively. The film thickness was 100 nm.

Example 7

Formation of In—Ga—O Amorphous Oxide Film by PLD Method

Deposition of an indium gallium oxide is described next. A SiO$_2$ glass substrate (#1737 produced by Corning) was prepared as the substrate for deposition. As the pre-deposition treatment, the substrate was degreased with ultrasonic waves in acetone, ethanol, and ultrapure water for 5 minutes each, and then dried in air at 100° C.

A (In$_2$O$_3$)$_{1-x}$—(Ga$_2$O$_3$)$_x$ (x=0 to 1) sinter was prepared as the target (size: 20 mm in dia., 5 mm in thickness). For example, when x=0.1, the target was an (In$_{0.9}$Ga$_{0.1}$)$_2$O$_3$ polycrystalline sinter. This target was obtained by wet-mixing the starting materials, In$_2$O$_3$—Ga$_2$O$_3$ (4N reagent), in a solvent (ethanol), calcining the resulting mixture (1000° C., 2 h), dry-milling the calcined mixture, and sintering the resulting mixture (1550° C., 2 h).

The ultimate vacuum inside the deposition chamber was 2×10$^{-6}$ (Pa), and the oxygen partial pressure during the deposition was 1 (Pa). The substrate temperature during the deposition was room temperature. The distance between the target and the substrate for deposition was 30 (mm). The power of the KrF excimer laser was 1.5 (mJ/cm$^2$/pulse), the pulse width was 20 (nsec), the repetition frequency was 10 (Hz), and the beam spot diameter was 1×1 (mm square). The deposition rate was 6 (nm/min).

The resulting film was subjected to grazing incidence x-ray diffraction (thin film method, incident angle: 0.5°) for the film surface, but no clear diffraction peak was observed. Thus, the In—Ga—O thin film obtained was proved to be amorphous. The film thickness was 120 nm. The electron carrier concentration and the electron mobility of the In—Ga—O amorphous oxide film obtained were 8×10$^{16}$/cm$^3$ and about 1 cm$^2$/(V·sec), respectively.

Example 8

Preparation of TFT Element (Glass Substrate) Using In—Zn—Ga—O Amorphous Oxide Film A top-gate TFT element shown in FIG. 5 was prepared. First, an In—Zn—Ga—O amorphous film 120 nm in thickness for use as a channel layer (2) was formed on a glass substrate (1) by a method of preparing the In—Ga—Zn—O amorphous oxide film according to EXAMPLE 1 at an oxygen partial pressure of 5 Pa while using a polycrystalline sinter represented by InGaO$_3$(ZnO)$_4$ as the target.

An In—Ga—Zn—O amorphous film having high electrical conductivity and a gold film each 30 nm in thickness were deposited on the In—Ga—Zn—O amorphous film by a PLD method while controlling the oxygen partial pressure inside the chamber to less than 1 Pa, and a drain terminal (5) and a source terminal (6) were formed by a photolithographic method and a lift-off method.

Lastly, an Y$_2$O$_3$ film (thickness: 90 nm, relative dielectric constant: about 15, leak current density: 10$^{-3}$ A/cm$^2$ upon application of 0.5 MV/cm) for use as a gate insulating film (3) was formed by an electron beam deposition method, and gold was deposited on the Y$_2$O$_3$ film. A gate terminal (4) was formed by a photolithographic method and a lift-off method. The channel length was 50 μm and the channel width was 200 μm.

(Evaluation of Characteristics of TFT Element)

Figure 6:
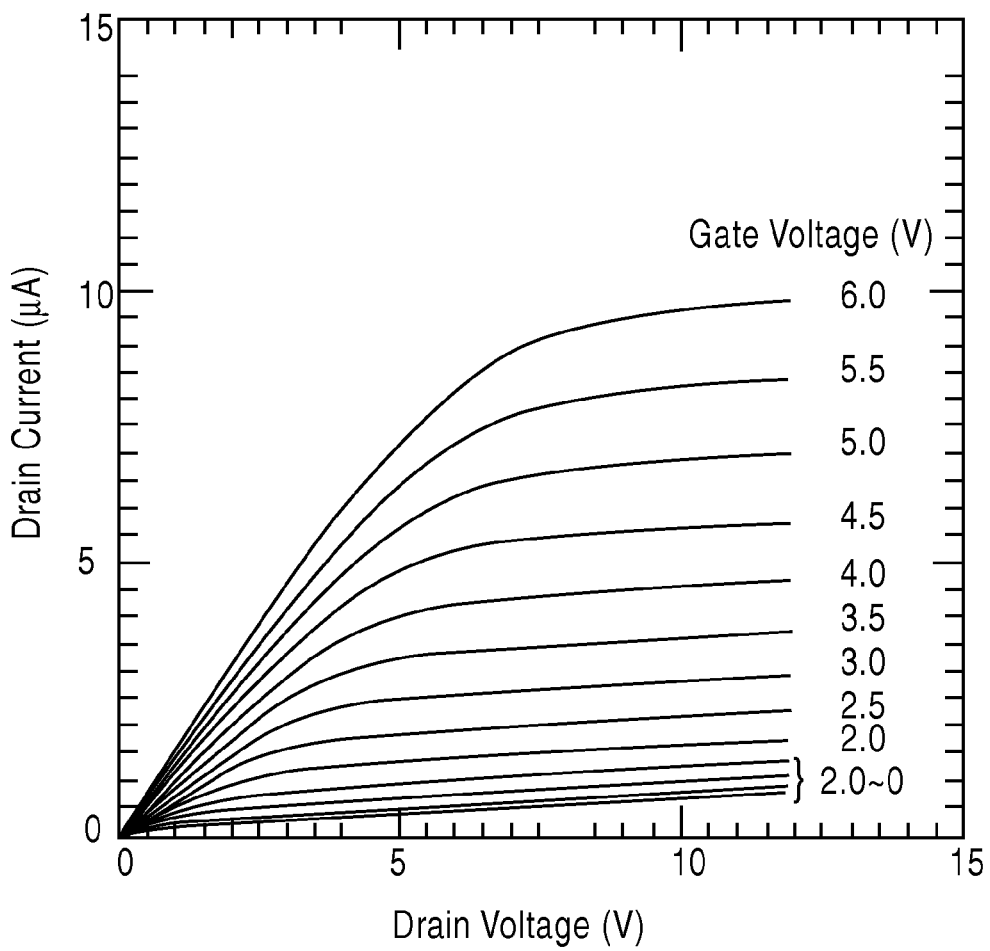
FIG. 6 is a graph showing a current-voltage characteristic of a top gate TFT element.

FIG. 6 shows the current-voltage characteristic of the TFT element measured at room temperature. Since the drain current I$_{DS}$ increased with the drain voltage V$_{DS}$, the channel was found to be of an n-conductivity type. This is consistent with the fact that the amorphous In—Ga—Zn—O oxide film is an n-type conductor. I$_{DS}$ was saturated (pinch-off) at about V$_{DS}$=6 V, which was a typical behavior for semiconductor transistors. The gain characteristic was determined, and the threshold value of the gate voltage V$_{GS}$ when V$_{DS}$=4 V was applied was about −0.5 V. Upon application of V$_{Gs}$=6 V and V$_{DS}$=10 V, current of I$_{DS}$=1.0×10$^{-5}$ A flowed. This is because carriers were induced in the In—Ga—Zn—O amorphous semiconductor thin film, i.e., an insulator, due to the gate bias. The on/off ratio of the transistor exceeded 10$^3$. The field effect mobility was determined from the output characteristics. As a result, a field effect mobility of about 7 cm$^2$(Vs)$^{-1}$ was obtained in the saturation region.

The same measurements were carried out on the element while irradiating the element with visible light, but no change in transistor characteristics was observed. Note that the film can be used as a channel layer of a TFT by controlling the electron carrier concentration of the amorphous oxide to less than 10$^{18}$/cm$^3$. An electron carrier concentration of 10$^{17}$/cm$^3$ or less was more preferable, and an electron carrier density of 10$^{16}$/cm$^3$ or less was yet more preferable.

According to this example, a tin film transistor having a channel layer with an increased electron carrier concentration, a high electrical resistance, and high electron mobility can be realized. The amorphous oxide described above exhibited excellent characteristics such as increased electron mobility with increasing electron carrier concentration and degenerate conduction.

In this example, the thin film transistor is formed on a glass substrate; however, since the film formation can be conducted at room temperature, a substrate such as a plastic board or a film can be used. Moreover, the amorphous oxide obtained in this example hardly absorbs visible light, and thus a transparent flexible TFT can be realized.

Example 9

Preparation of TFT Element Using In—Zn—Ga—O Amorphous Oxide Film

A top-gate TFT element shown in FIG. 5 was prepared. In particular, an In—Zn—Ga—O amorphous oxide film 120 nm in thickness for use as a channel layer (2) was formed on a polyethylene terephthalate (PET) film (1) by a deposition method of EXAMPLE 2 in an atmosphere at an oxygen partial pressure of 5 Pa using a polycrystalline sinter represented by InGaO$_3$(ZnO) as the target.

An In—Zn—Ga—O amorphous oxide film having high electrical conductivity and a gold film each 30 nm in thickness were deposited on the In—Zn—Ga—O amorphous oxide film by the PLD method at an oxygen partial pressure inside the chamber of less than 1 Pa, and a drain terminal (5) and a source terminal (6) were formed by a photolithographic method and a lift-off method.

Lastly, a gate insulating film (3) was formed by an electron beam deposition method and gold is deposited thereon. A gate terminal (4) was then formed by a photolithographic method and a lift-off method. The channel length was 50 μm and the channel width was 200 μm. Three types of TFTs with the above-described structure were prepared using $Y_2O_3$ (thickness: 140 nm), $Al_2O_3$ (thickness: 130 nm) and $HfO_2$ (thickness: 140 nm), respectively.

(Evaluation of Characteristics of TFT Element)

The current-voltage characteristic of the TFT element measured at room temperature was similar to one shown in FIG. 6. Namely, since the drain current $I_{DS}$ increased with the drain voltage $V_{DS}$, the channel was found to be of an n-conductivity type. This is consistent with the fact that the amorphous In—Ga—Zn—O amorphous oxide film is an n-type conductor. $I_{DS}$ was saturated (pinch-off) at $V_{DS}$=about 6 V, which was a typical behavior for semiconductor transistors. When $V_{GS}$=6 V and $V_{DS}$=10 V, current of $I_{ds}$=1×10$^{-5}$ A flowed. This is because carriers were induced in the In—Ga—Zn—O amorphous oxide thin film, i.e., an insulator, due to the gate bias. The on/off ratio of the transistor exceeded 10$^3$. The field effect mobility was determined from the output characteristics. As a result, a field effect mobility of about 7 cm$^2$(Vs)$^{-1}$ was obtained in the saturation region.

The element formed on the PET film was inflected at a radius of curvature of 30 mm, and the same transistor characteristic was measured. No change in transistor characteristic was observed.

The TFT including the gate insulating film made from the $Al_2O_3$ film also showed similar transistor characteristics to those shown in FIG. 6. When $V_{GS}$=6 V and $V_{DS}$=0, current of $I_{ds}$=10$^{-8}$ A flowed, and when $V_{DS}$=10 V, current of $I_{ds}$=5.0×10$^{-6}$ A flowed. The on/off ratio of the transistor exceeded 10$^2$. The field effect mobility was determined from the output characteristics. As a result, a field effect mobility of about 2 cm$^2$(Vs)$^{-1}$ was obtained in the saturation region.

The TFT including the gate insulating film made from the $HfO_2$ film also showed similar transistor characteristics to those shown in FIG. 6. When $V_g$=0 V, current of $I_{ds}$=10$^{-8}$ A flowed, and when $V_g$=10 V, current of $I_{ds}$=1.0×10$^{-6}$ A flowed. The on/off ratio of the transistor exceeded 10$^2$. The field effect mobility was determined from the output characteristics. As a result, a field effect mobility of about 10 cm$^2$(Vs)$^{-1}$ was obtained in the saturation region.

Example 10

Preparation of TFT Element Using $In_2O_3$ Amorphous Oxide Film by PLD Method

A top-gate TFT element shown in FIG. 5 was prepared. First, an $In_2O_3$ amorphous oxide film 80 nm in thickness for use as a channel layer (2) was formed on a polyethylene terephthalate (PET) film (1) by the deposition method of EXAMPLE 5.

An $In_2O_3$ amorphous oxide film having high electrical conductivity and a gold layer each 30 nm in thickness were formed on this $In_2O_3$ amorphous oxide film by the PLD method at an oxygen partial pressure inside the chamber of less than 1 Pa while applying zero voltage to the oxygen radical generator. A drain terminal (5) and a source terminal (6) were then formed by a photolithographic method and a lift-off method.

Lastly, an $Y_2O_3$ film for use as a gate insulating film (3) was formed by an electron beam deposition method, and gold was deposited on the $Y_2O_3$ film. A gate terminal (4) was formed by a photolithographic method and a lift-off method.

(Evaluation of Characteristics of TFT Element)

The current-voltage characteristics of the TFT element formed on the PET film were measured at room temperature. Since the drain current $I_{DS}$ increased with the drain voltage $V_{DS}$, the channel was found to be of an n-conductivity type. This is consistent with the fact that the amorphous In—O amorphous oxide film is an n-type conductor. $I_{DS}$ was saturated (pinch-off) at $V_{DS}$=about 5 V, which was a typical behavior for semiconductor transistors. When $V_{GS}$=6 V and $V_{DS}$=0, current of $I_{ds}$=2×10$^{-8}$ A flowed, and when $V_{DS}$=10 V current of $I_{ds}$=2.0×10$^{-6}$ A flowed. This is because carriers were induced in the In—O amorphous oxide thin film, i.e., an insulator, due to the gate bias. The on/off ratio of the transistor was about 10$^2$. The field effect mobility was determined from the output characteristics. As a result, a field effect mobility of about 10 cm$^2$(Vs)$^{-1}$ was obtained in the saturation region.

The TFT element formed on a glass substrate showed similar characteristics. The element formed on the PET film was inflected at a radius of curvature of 30 mm, and the same transistor characteristics were measured. No change in transistor characteristics was observed.

Example 11

Preparation of TFT Element Using In—Sn—O Amorphous Oxide Film by PLD Method

A top gate TFT element shown in FIG. 5 was prepared. In particular, an In—Sn—O amorphous oxide film 100 nm in thickness for use as a channel layer (2) was formed on a polyethylene terephthalate (PET) film (1) by a deposition method of EXAMPLE 6.

An In—Sn—O amorphous oxide film having high electrical conductivity and a gold film each 30 nm in thickness were deposited on this In—Sn—O amorphous oxide film by the PLD method at an oxygen partial pressure inside the chamber of less than 1 Pa while applying zero voltage to the oxygen radical generator. A drain terminal (5) and a source terminal (6) were formed by a photolithographic method and a lift-off method.

Lastly, an $Y_2O_3$ film for use as a gate insulating film (3) was formed by an electron beam deposition method and gold was deposited thereon. A gate terminal (4) was then formed by a photolithographic method and a lift-off method.

(Evaluation of Characteristics of TFT Element)

The current-voltage characteristic of the TFT element formed on the PET film was measured at room temperature. Since the drain current $I_{DS}$ increased with the drain voltage $V_{DS}$, the channel was found to be of an n-conductivity type. This is consistent with the fact that the amorphous In—Sn—O amorphous oxide film is an n-type conductor. $I_{DS}$ was saturated (pinch-off) at $V_{DS}$=about 6 V, which was a typical behavior for semiconductor transistors. When $V_{GS}$=6 V and $V_{DS}$=0 V, current of $I_{ds}$=5×10$^{-8}$ A flowed, and when $V_{DS}$=10 V, current of $I_{ds}$=5.0×10$^{-5}$ A flowed. This is because carriers were induced in the In—Sn—O amorphous oxide thin film, i.e., an insulator, due to the gate bias. The on/off ratio of the transistor was about 10$^3$. The field effect mobility was determined from the output characteristics. As a result, a field effect mobility of about 5 cm$^2$(Vs)$^{-1}$ was obtained in the saturation region.

The TFT element formed on a glass substrate showed similar characteristics. The element formed on the PET film was inflected at a radius of curvature of 30 mm, and the same transistor characteristics were measured. No change in transistor characteristics was observed.

Example 12

Preparation of TFT Element Using In—Ga—O Amorphous Oxide Film by PLD Method

A top gate TFT element shown in FIG. 5 was prepared. In particular, an In—Ga—O amorphous oxide film 120 nm in thickness for use as a channel layer (2) was formed on a polyethylene terephthalate (PET) film (1) by the deposition method of EXAMPLE 7.

An In—Ga—O amorphous oxide film having high electrical conductivity and a gold film each 30 nm in thickness were formed on this In—Ga—O amorphous oxide film by the PLD method at an oxygen partial pressure inside the chamber of less than 1 Pa while applying zero voltage to the oxygen radical generator. A drain terminal (5) and a source terminal (6) were formed by a photolithographic method and a lift-off method.

Lastly, an $Y_2O_3$ film for use as a gate insulating film (3) was formed by an electron beam deposition method and gold was deposited thereon. A gate terminal (4) was then formed by a photolithographic method and a lift-off method.

(Evaluation of Characteristics of TFT Element)

The current-voltage characteristic of the TFT element formed on the PET film was measured at room temperature. Since the drain current $I_{DS}$ increased with the drain voltage $V_{DS}$, the channel was found to be of an n-conductivity type. This is consistent with the fact that the amorphous In—Ga—O amorphous oxide film is an n-type conductor. $I_{DS}$ was saturated (pinch-off) at $V_{DS}$=about 6 V, which was a typical behavior for semiconductor transistors. When $V_{GS}$=6V and $V_{DS}$=0 V, current of $I_{ds}$=1×10$^{-8}$ A flowed, and when $V_{DS}$=10 V, current of $I_{ds}$=1.0×10$^{-6}$ A flowed. This corresponds to the induction of electron carriers inside the insulator, In—Ga—O amorphous oxide film by the gate bias. The on/off ratio of the transistor was about $10^2$. The field effect mobility was determined from the output characteristics. As a result, a field effect mobility of about 0.8 $cm^2(Vs)^{-1}$ was obtained in the saturation region.

The TFT element formed on a glass substrate showed similar characteristics. The element formed on the PET film was inflected at a radius of curvature of 30 mm, and the same transistor characteristics were measured. No change in transistor characteristics was observed.

It should be noted that, as described in EXAMPLES above, the film can be used as a channel layer of a TFT by controlling the electron carrier concentration to less than $10^{18}/cm^3$. The electron carrier concentration is more preferably $10^{17}/cm^3$ or less and yet more preferably $10^{16}/cm^3$ or less.

Industrial Applicability

The amorphous oxide of the present invention can be used in semiconductor devices such as thin film transistors. The thin film transistors can be used as switching elements of LCDs and organic EL displays and are also widely applicable to see-through-type displays, IC cards, ID tags, etc.

What is claimed is:

1. A thin film transistor device comprising:
   a drain electrode;
   a source electrode;
   a channel layer contacting the drain electrode and the source electrode,
      wherein the channel layer is formed of an amorphous $In_xSn_{1-x}$Oxide ($0.8 \le x \le 0.9$) consisting of $SnO_2$ in the presence of $In_2O_3$ as a host oxide, further the channel layer is prepared by a sputtering method or a pulsed laser deposition method using a $In_2O_3$—$SnO_2$ polycrystalline sinter as a target in an atmosphere containing oxygen gas, and
      the channel layer having a transparent, semi-insulating property represented by the electron mobility is more than 1 $cm^2/(V \cdot sec)$ and the electron carrier concentration is $10^{18}/cm^3$ or less as measured by Hall-effect measurement at room temperature;
   a gate electrode; and
   a gate insulating film positioned between the gate electrode and the channel.

* * * * *